United States Patent [19]

Schlesier

[11] Patent Number: 4,701,241

[45] Date of Patent: Oct. 20, 1987

[54] METHOD OF MAKING A RESISTOR

[75] Inventor: Kenneth M. Schlesier, Delaware Township, Hunterdon County, N.J.

[73] Assignee: RCA Corporation, Princeton, N.J.

[21] Appl. No.: 915,649

[22] Filed: Oct. 6, 1986

[51] Int. Cl.$^4$ .................. H01L 21/306; B44C 1/22; C03C 15/00; C23F 1/00
[52] U.S. Cl. ............................ 156/643; 156/652; 156/657; 156/659.1; 156/662; 357/51; 437/228; 437/918
[58] Field of Search .................. 357/51, 59; 338/311, 338/314; 29/610 R, 620, 576 B, 580; 148/1.5, 187; 156/643, 644, 646, 652, 657, 659.1, 662, 661.1; 204/192 E

[56] References Cited

U.S. PATENT DOCUMENTS 4,146,902  3/1979  Tanimoto et al. .................. 357/6
4,326,213  4/1982  Shirai et al. ..................... 351/51
4,408,385 10/1983  Rao et al. ...................... 29/576 B
4,451,328  3/1984  Dubois ........................... 156/662

Primary Examiner—William A. Powell
Attorney, Agent, or Firm—Allen Le Roy Limberg; Henry I. Steckler

[57] ABSTRACT

A method of forming a resistor comprises forming a conducting layer on a substrate. An area of the layer is removed such as by etching. A resistor portion is formed in the area. The conducting layer including the resistor portion can be p-Si. The substrate can comprise an insulator such as $Al_2O_3$ and a barrier layer can be formed on the substrate to achieve improved radiation hardening.

15 Claims, 4 Drawing Figures

METHOD OF MAKING A RESISTOR

The Government has rights in this invention pursuant to Subcontract No. A6ZV-700000-E-507 under Contract No. FO4704-84-C-0061 awarded by the Department of the Air Force.

BACKGROUND OF THE INVENTION

The present invention relates a method of making a resistor and, more particularly, a radiation hard resistor.

Radiation hardened circuits can require high value, e.g., 100,000 ohms, radiation hard resistors to prevent discharge of selected nodes during radiation transients. In order to make a radiation hard resistor, a high doping level is required so that radiation induced carriers are relatively small in number compared to the normally existing carriers. Thus the resistance value does not significantly change during radiation transients. However, a high doping level in a resistive material such as polycrystalline silicon (p-Si) results in a low value of resistivity, e.g., 20 ohms/square, when used with a p-Si thickness of 500–600 nanometers (nm), which is a typical thickness for p-Si gate electrodes and circuit interconnects. Hence a thinner layer of p-Si must be used to achieve the required high resistivity, e.g., $10^4$ ohms/square. The resistor area cannot be masked off when depositing the relatively thick p-Si gate electrodes and interconnects since the required high deposition temperatures would destroy the mask.

It is, therefore, desirable to have a method of forming a relatively high value radiation hard resistor.

SUMMARY OF THE INVENTION

A method of forming a resistor on a substrate comprises forming a conducting layer with a first thickness on said substrate, removing said layer from a selected area of said substrate, and forming a resistor portion in said area with a second thickness less than said first thickness.

DETAILED DESCRIPTION OF THE PREFERRED EMBODIMENTS

Figure 1:
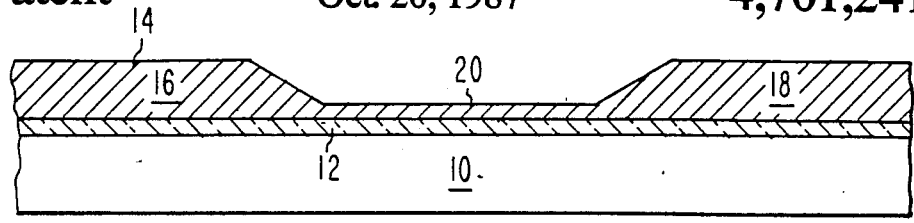
FIG. 1 shows a cross section of a resistor made in accordance with the method of the invention.

In FIG. 1 a substrate 10 has an overlying barrier layer 12 thereon. The layer 12 provides a barrier in the vertical direction to radiation induced currents as described in U.S. patent application Ser. No. 900,598, filed Aug. 26, 1986. In particular, the layer 12 does not generate radiation induced currents due to its thinness. Overlying the barrier layer 12 is a conducting layer 14 having highly conductive portions 16 and 18 and a resistor portion 20 therebetween. In a particular embodiment the resistor portion 20 has a length of 8 micrometers ($\mu$) and a width (the direction perpendicular to the drawing) of $3\mu$.

The substrate 10 can comprise an insulator such as $Al_2O_3$, $SiO_2$, or spinel. If the resistor portion 20 is used in a non-SOI structures, then the substrate 10 can comprise an inexpensive semiconductor such as bulk silicon (Si). The barrier layer 12 can comprise an insulator such as silicon oxide having a maximum thickness of about 300 nm. If the barrier layer 12 is too thin, it will be a less effective barrier to photocurrents due to tunneling of carriers, while if it is too thick, it becomes a source of photocarriers. A thickness of about 100 nm works well. The barrier layer 12 can also comprise a material that is different from the substrate 10 and the layer 14 and has a wider bandgap than either of them. The conducting layer 14 can comprise p-Si.

Figure 2:
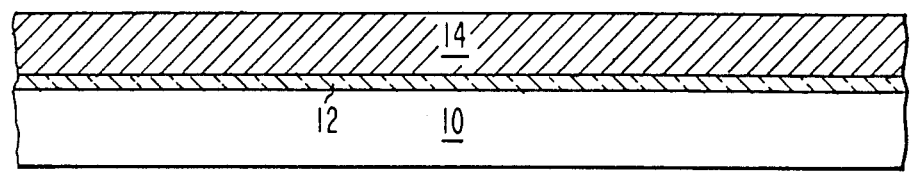
FIGS. 2–4 show the resistor of FIG. 1 during sequential manufacturing steps.

In FIG. 2 the barrier layer 12 is deposited on the layer 10 by the thermal reaction of $SiH_4$ and $O_2$ at 450° C. at a pressure of one atmosphere. Then the conducting layer 14 is deposited to a first thickness between about 500 and 600 nm using chemical vapor deposition (CVD) of $SiH_4$ at 560° C. This layer will be amorphous Si (a-Si), which is then doped with P at a temperature of about 870° C. to a density between about and $10^{20}$ and $10^{21}$ cm$^{-3}$. This converts the layer 14 from a-Si to p-Si. Alternately ion implanting or in situ doping using $PH_3$ can be used.

Figure 3:
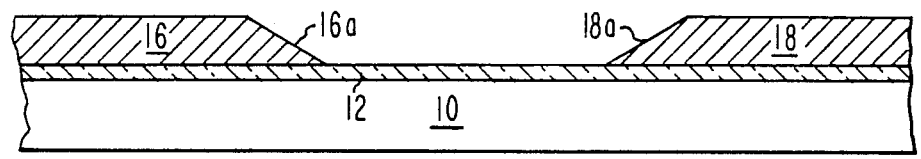

As shown in FIG. 3, the conducting layer 14 is then anisotropically plasma etched using a first mask (not shown). The etching results in the formation of the sloped sides 16a and 18a of the portions 16 and 18, respectively, and the complete removal of p-Si therebetween, thereby defining the length of the resistor portion 20. It is believed that the sloped sides 16a and 18a help prevent an open circuit from occurring between the portions 16 and 18 and the resistor portion 20.

Figure 4:
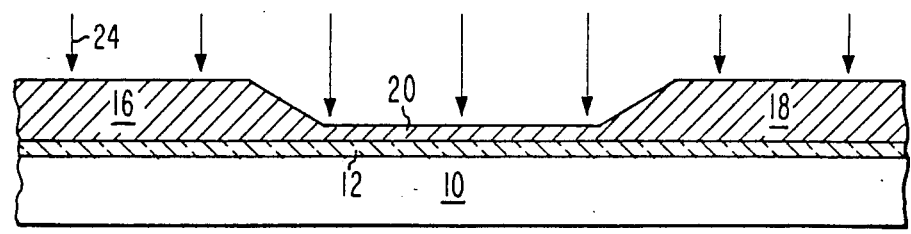

Thereafter, a-Si material for the resistor portion 20 is deposited (FIG. 4) using $SiH_4$ at 560° C. to a maximum second thickness of about 100 nm. In a particular embodiment a thickness of about 75 nm was used. As indicated by the arrows 24, the portions 16, 18 and 20 are doped by ion implanting with an N type dopant such as P. An energy of 25 Kiloelectron volts and an areal density of $5 \times 10^{14}$ ions/cm$^2$ were used to achieve a doping level of about $10^{19}$ cm$^{-3}$. Since this level is low compared to the doping levels of the portions 16 and 18, it has essentially no effect thereon. Then a plasma anisotropic etching is done to laterally define the portions 16, 18 and 20 using a second mask (not shown) having an aperture with a smaller width than the first mask. This prevents the resistor portion 20 from being short circuited by the remainder of the layer 14 due to misalignment between the first and second masks. The second mask can be the same mask that is used to define the gate electrodes and interconnects of a circuit. Thereafter, a reoxidation step is used to improve gate oxide (not shown) integrity. This activates the implants, converts a-Si to p-Si and makes thinner the resistor portion 20, thereby raising its resistance.

The remaining steps for completing an integrated circuit are conventional. Oxide is deposited by CVD of $SiH_4$ in an $O_2$ atmosphere. Borophosphosilicate glass is deposited at 850° C. Contact holes are etched, and then metallization is done.

What is claimed is:

1. A method of forming a resistor on a substrate comprising:
    forming a conducting layer with a first thickness on said substrate;
    removing said layer from a selected area of said substrate; and
    forming a resistor portion in said area with a second thickness less than said first thickness.

2. The method of claim 1 further comprising forming a barrier layer between said substrate and said conducting layer.

3. The method of claim 2 wherein said barrier layer comprises silicon oxide.

4. The method of claim 2 wherein said barrier layer comprises a material having a larger bandgap than said conducting layer and said substrate.

5. The method of claim 2 wherein said barrier layer has a maximum thickness of about 300 nm.

6. The method of claim 5 wherein said barrier layer has a thickness of about 100 nm.

7. The method of claim 1 wherein said substrate comprises $Al_2O_3$.

8. The method of claim 1 wherein said substrate comprises Si.

9. The method of claim 1 wherein said conducting layer comprises p-Si.

10. The method of claim 1 wherein said forming steps each comprise depositing and doping said conducting layer and said resistor portion respectively.

11. The method of claim 10 wherein said conducting layer comprises conducting portions having a doping level of between about $10^{20}$ and $10^{21}$ cm$^{-3}$ and said resistor portion has a doping level of about $10^{19}$ cm$^{-3}$.

12. The method of claim 1 wherein said removing step comprises etching.

13. The method of claim 12 wherein said etching step comprises an isotropic plasma etching.

14. The method of claim 11 wherein said resistor forming step comprises depositing material for the resistor portion and etching said material.

15. The method of claim 1 wherein said first thickness is about 500 to 600 nm and said second thickness is about 75 nm.

\* \* \* \* \*